United States Patent [19]
Matsumoto et al.

[11] Patent Number: 5,996,242
[45] Date of Patent: Dec. 7, 1999

[54] DRYING APPARATUS AND METHOD

[75] Inventors: Akinori Matsumoto; Takeshi Kuroda, both of Hyogo; Cozy Ban, Tokyo; Toko Konishi, Tokyo; Naoki Yokoi, Tokyo, all of Japan

[73] Assignees: Ryoden Semiconductor System Engineering Corporation, Itami; Mitsubishi Denki Kabushiki Kaisha, Tokyo, both of Japan

[21] Appl. No.: 08/935,838

[22] Filed: Sep. 23, 1997

[30] Foreign Application Priority Data

Apr. 4, 1997 [JP] Japan ..................................... 9-086598

[51] Int. Cl.⁶ .................................................. F26B 21/06
[52] U.S. Cl. .................................................................. 34/76
[58] Field of Search ........................... 34/78, 76; 432/253, 432/254.1, 245

[56] References Cited

U.S. PATENT DOCUMENTS

| | | |
|---|---|---|
| 5,183,067 | 2/1993 | Slinn . |
| 5,369,891 | 12/1994 | Kamikawa . |
| 5,535,525 | 7/1996 | Gardner . |

FOREIGN PATENT DOCUMENTS

| | | |
|---|---|---|
| 61-241927 | 10/1986 | Japan . |
| 3-70134 | 3/1991 | Japan . |
| 4-79223 | 3/1992 | Japan . |
| 6-77203 | 3/1994 | Japan . |

*Primary Examiner*—Henry Bennett
*Assistant Examiner*—Malik N. Drake
*Attorney, Agent, or Firm*—Oblon, Spivak, McClelland, Maier & Neustadt, P.C.

[57] ABSTRACT

A nozzle and an exhaust member are provided opposite to each other with an upward opening of a processing vessel interposed therebetween. A side wall of the processing vessel is smoothly curved inward as the opening is approached upward. The nozzle spouts a nitrogen gas fed from a nitrogen gas feeder as a jet for covering the opening toward an exhaust port of the exhaust member. The jet can effectively function as a curtain because the side wall of the processing vessel is curved. Therefore, a cooling coil necessary for a conventional apparatus is not required. Consequently, instability of the state of the IPA vapor caused by the cooling coil can be eliminated so that defective dryness is relieved or eliminated.

20 Claims, 12 Drawing Sheets

F I G. 3
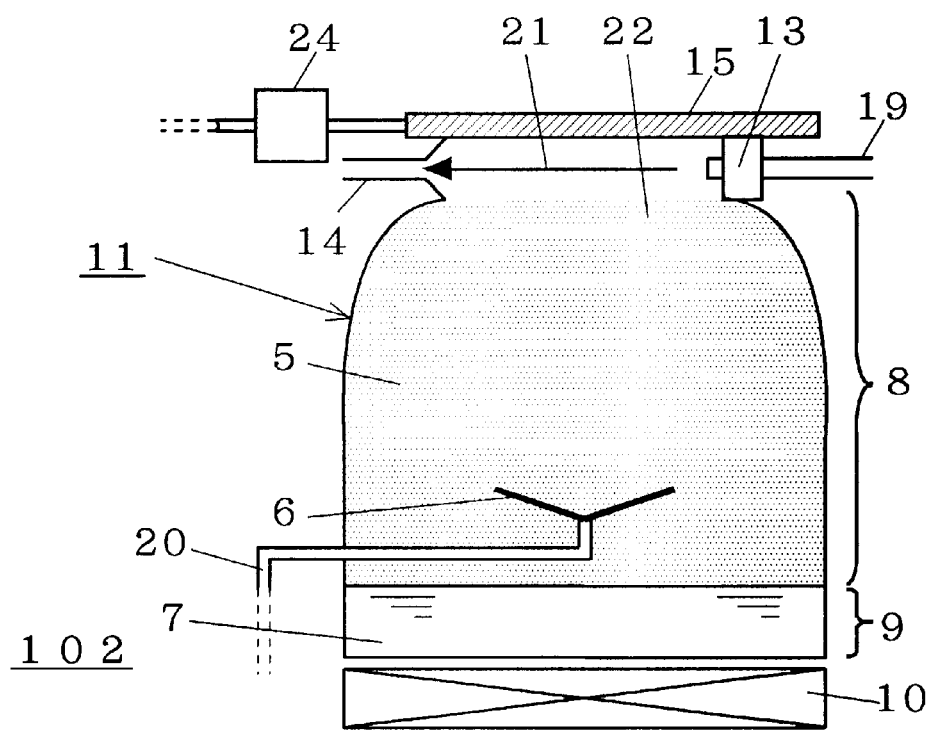

DRYING APPARATUS AND METHOD

BACKGROUND OF THE INVENTION

1. Field of the Invention

The present invention relates to a drying technique suitable for drying a semiconductor wafer, and more particularly to improvement to prevent defective dryness and to reduce a size and cost of an apparatus.

2. Description of the Background Art

FIG. 16 is a sectional front view showing a structure of a drying apparatus according to the prior art which is the background of the present invention. A drying apparatus 151 is formed to dry a semiconductor wafer. The drying apparatus 151 comprises a processing vessel 171 having an upper end opened. A cooling coil 162 is attached to an inside of an upper portion of a side wall of the processing vessel 171 along the side wall of the processing vessel 171. The cooling coil 162 is formed of a silica tube, in which cooling water is caused to flow.

A heater 170 is provided just below a bottom portion of the processing vessel 171. Furthermore, a pan 166 is fixed to a position between the bottom portion and the upper open end in the processing vessel 171. A pipe 180 for draining the pan 166 is connected to a bottom portion of the pan 166. A fire extinguishing nozzle 172 is provided on an upper portion of the processing vessel 171. The fire extinguishing nozzle 172 serves to spout a fire extinguishing gas when a fire is caused in the processing vessel 171.

When using the drying apparatus 151, an IPA (isopropyl alcohol) solution 167 is first poured into the processing vessel 171. A depth of the processing vessel 171 is regulated in such a manner that a liquid level does not reach the bottom portion of the pan 166. The cooling water is caused to flow in the cooling coil 162.

When the heater 170 is turned on, the IPA solution 167 is heated. As a result, the IPA solution 167 is vaporized so that an IPA vapor 165 is generated. The IPA vapor 165 is filled into the processing vessel 171. The IPA vapor 165 is cooled and condenses in the vicinity of the cooling coil 162. More specifically, the cooling coil 162 serves to prevent the IPA vapor 165 from leaking out of the processing vessel 171.

Accordingly, the IPA solution 167 is stored in a liquid storing section 169 provided in the vicinity of the bottom portion of the processing vessel 171, and the IPA vapor 165 is filled into a vapor filling section 168 from a top of the IPA solution 167 to the vicinity of the cooling coil 162. After the IPA vapor 165 is filled into the vapor filling section 168, a processing is started for a semiconductor wafer 163 to be processed. After a rinsing processing is completed, a lot of semiconductor wafers 163 and a cassette 164 carrying them are suspended from a holding arm 161 and are inserted into the vapor filling section 168 from above the processing vessel 171. The cassette 164 carrying the semiconductor wafers 163 is held by the holding arm 161 just above the pan 166 as shown in FIG. 16.

Consequently, the IPA vapor 165 filled into the vapor filling section 168 condenses and dissolves into waterdrops which stick to surfaces of the semiconductor wafers 163 and the cassette 164. As a result, the waterdrops are essentially changed to IPA droplets. The IPA droplets slip from the surfaces of the semiconductor wafers 163 and the cassette 164. Thus, the semiconductor wafers 163 and the cassette 164 which are wet with the waterdrops can he dried. The slipping IPA droplets are collected by the pan 166 and discharged to an outside through the pipe 180.

When the drying processing is completed, the cassette 164 is pulled up by the holding arm 161 and is taken out of the processing vessel 171. Then, the cassette 164 thus taken out is delivered to a next processing step. Thereafter, new (i.e. unprocessed) semiconductor wafers 163 and a new cassette 164 are put into the processing vessel 171. Thus, the semiconductor wafers 163 and the cassette 164 are dried repeatedly.

In the drying apparatus 151 according to the prior art described above, the IPA vapor 165 is cooled by using the cooling coil 162 in which the cooling water flows, thereby preventing the IPA vapor 165 from leaking out of the processing vessel 171. For this reason, the IPA vapor 165 is sensitively affected by a temperature and flow of the cooling water in the cooling coil 162. More specifically, when conditions of the cooling water are changed, a state of the IPA vapor 165 such as a concentration of the vapor 165 or the extension of the vapor filling section 168 is varied.

When the state of the IPA vapor 165 is changed, an amount of the IPA vapor 165 condensing on the surfaces of the semiconductor wafers 163 and the cassette 164 is varied. As a result, defective dryness is sometimes caused, that is, the drying processing is not fully performed. Consequently, the yield of a semiconductor device manufactured in the semiconductor wafer 163 is deteriorated.

Furthermore, the processing vessel 171 requires an extra space for placing the cooling oil 162. Consequently, a size of the apparatus cannot be reduced. In order to prevent metallic contamination on the semiconductor wafer 163, the silica tube is used for the cooling coil 162. However, the silica tube is expensive so that a manufacturing cost of the apparatus is increased. In addition, the cooling coil 162 formed of the silica tube has a complicated structure. Therefore, it takes a long time and a high cost to repair the apparatus when troubles are made.

SUMMARY OF THE INVENTION

A first aspect of the present invention is directed to a drying apparatus for storing and heating a water-soluble solvent, and causing a vapor generated from the solvent to condense on a surface of an object to be processed, thereby drying the surface of the object, comprising a container-shaped processing vessel defining an upward opening on a top thereof and capable of storing the solvent, a heater capable of heating the solvent stored in the processing vessel, and a nozzle and exhaust means provided opposite to each other with the opening interposed therebetween.

The exhaust means defines an exhaust port for opening toward the nozzle, the nozzle can receive a supply of a gas to generate a jet of the gas which is spouted toward the exhaust port and covers the opening, the exhaust means can discharge, to an outside, the gas sucked through the exhaust port, and the processing vessel has a side wall which is smoothly curved inward as the opening is approached upward.

A second aspect of the present invention is directed to the drying apparatus according to the first aspect of the present invention, further comprising a cap for freely covering the opening.

A third aspect of the present invention is directed to the drying apparatus according to the first or second aspect of the present invention, further comprising a switching valve having an output coupled to the nozzle and being capable of freely selecting one of inputs to communicate with the output.

A fourth aspect of the present invention is directed to the drying apparatus according to the third aspect of the present invention, further comprising nonreactive gas feeding means for feeding a nonreactive gas, fire extinguishing gas feeding means for feeding a fire extinguishing gas, a sensor for sensing that a fire is caused in the processing vessel and for outputting a predetermined signal, and control means for controlling the switching operation of the switching valve in response to the signal output from the sensor.

The nonreactive gas feeding means is connected to one of the inputs, the fire extinguishing gas feeding means is connected to another one of the inputs, and the control means receives the signal to control the switching valve such that the input selected by the switching valve is switched from the input to which the nonreactive gas feeding means is connected to the input to which the fire extinguishing gas feeding means is connected.

A fifth aspect of the present invention is directed to the drying apparatus according to any of the first to third aspects of the present invention, wherein the nozzle can receive the supply of the gas to freely select and generate either the jet of the gas spouted toward the exhaust port and covering the opening or a jet of the gas spouted toward an inside of the processing vessel.

A sixth aspect of the present invention is directed to the drying apparatus according to the fifth aspect of the present invention, wherein the nozzle includes an inner nozzle member and an outer nozzle member engaged with an outside of the inner nozzle member, the inner nozzle member defines, on an inside thereof, a path causing a single inlet to branch off into two outlets, the outer nozzle member defines two openings, and one of the inner nozzle member and the outer nozzle member is rotatably engaged with the other and only one of the two outlets of the inner nozzle member selectively overlaps with either of the two openings of the outer nozzle member on the basis of a position of rotation.

A seventh aspect of the present invention is directed to the drying apparatus according to the fifth or sixth aspect of the present invention, further comprising a sensor for sensing that a fire is caused in the processing vessel and for outputting a predetermined signal, and control means for controlling the switching operation of the nozzle in response to the signal output from the sensor, wherein the control means receives the signal to control the nozzle so as to perform switching from the jet spouted toward the exhaust port to the jet spouted toward the inside of the processing vessel.

An eighth aspect of the present invention is directed to the drying apparatus according to the third aspect of the present invention, further comprising ordinary temperature gas feeding means for feeding a nonreactive gas having an ordinary temperature, cooled gas feeding means for feeding a cooled nonreactive gas, and control means for controlling the switching operation of the switching valve, wherein the ordinary temperature gas feeding means is connected to one of the inputs, the cooled gas feeding means is connected to another one of the inputs, and the control means controls the switching valve such that the jet generated by the nozzle is a jet of the cooled nonreactive gas only when the object to be processed is put into the processing vessel.

A ninth aspect of the present invention is directed to the drying apparatus according to the fourth or eighth aspect of the present invention, further comprising a plurality of units, each unit including the processing vessel, the heater, the nozzle, the exhaust means and the switching valve, and two branching pipes, wherein said nonreactive gas feeding means and said extinguishing gas feeding means are single in number for each and are connected in common to the switching valve belonging to each of the units through the two branching pipes.

A tenth aspect of the present invention is directed to the drying apparatus according to any of the first to fourth aspects of the present invention, wherein the nozzle includes a check valve for opening a path of the gas when the supply of the gas is received, and for blocking the path when the supply of the gas is not received.

An eleventh aspect of the present invention is directed to the drying apparatus according to the first or second aspect of the present invention, further comprising nonreactive gas feeding means for feeding a nonreactive gas, wherein the nonreactive gas feeding means is connected to the nozzle.

A twelfth aspect of the present invention is directed to the drying apparatus according to the eleventh aspect of the present invention, further comprising a pipe and cooling means provided in at least a part of the pipe, wherein the nonreactive gas feeding means is connected to the nozzle through the pipe, and the cooling means can cool the nonreactive gas flowing through the pipe.

A thirteenth aspect of the present invention is directed to the drying apparatus according to any of the first to twelfth aspects of the present invention, further comprising a pan provided in the processing vessel in an intermediate position between a bottom portion of the processing vessel and the opening of the processing vessel, and a pipe coupled to a bottom portion of the pan for discharging a liquid poured into the pan to an outside of the drying apparatus.

A fourteenth aspect of the present invention is directed to a method for drying a surface of the object to be processed using the drying apparatus according to any of the first to thirteenth aspects of the present invention, comprising the steps of preparing the drying apparatus, feeding the solvent into the processing vessel to store the solvent in a part of the processing vessel, feeding a nonreactive gas to the nozzle to generate a jet of the nonreactive gas so as to cover the opening, driving the heater to heat the solvent, inserting the object into the processing vessel through the opening across the jet, holding the inserted object above a liquid level of the solvent and drying the surface of the object by a vapor of the heated solvent, and taking the object to an outside of the processing vessel through the opening across the jet again after the drying step.

According to the first aspect of the present invention, the nonreactive gas is fed to the nozzle so that the jet of the nonreactive gas is generated. As a result, a kind of curtain for covering the opening of the processing vessel is formed. Since the processing vessel has the curved side wall, the vapor generated from the solvent can effectively be prevented from flowing to the outside by the curtain of the nonreactive gas. Therefore, a cooling coil necessary for a conventional apparatus is not required.

Since the cooling coil is not required, a state of the vapor filled into the processing vessel is stabilized. Consequently, defective dryness of the object to be processed can be relieved or eliminated. Furthermore, an upper layer portion of the processing vessel necessary for placing the cooling coil is not required. Therefore, a size of the apparatus can be reduced. In addition, a complicated and expensive cooling coil is not required. Thus, manufacturing and repair costs of the apparatus can be reduced and repair can be performed rapidly.

According to the second aspect of the present invention, the cap for freely covering the opening of the processing vessel is provided. When the object to be processed is not put in, the cap blocks the opening so that the state of the vapor in the processing vessel can be kept stable even if the nonreactive gas is not spouted from the nozzle. Consequently, an amount of the nonreactive gas to be used can be reduced.

According to the third aspect of the present invention, the switching valve is provided. Therefore, the nonreactive gas can be usually fed to the nozzle, and the fire extinguishing gas can be fed when a fire is caused in the processing vessel, for example. Thus, it is possible to select one of plural kinds of gases to be fed to the nozzle if necessary.

According to the fourth aspect of the present invention, the nonreactive gas feeding means and the fire extinguishing gas feeding means are connected to the switching valve, and the control means is provided. The control means serves to control the switching valve in response to the signal output from the sensor for sensing a fire. Therefore, when the fire is caused in the processing vessel, the fire extinguishing gas is automatically spouted from the nozzle. In other words, the fire can automatically be put out. Furthermore, a fire extinguishing nozzle is not required separately. Therefore, a size of the apparatus can be reduced still more.

According to the fifth aspect of the present invention, the nozzle can freely spout the fed gas toward either the exhaust port or the inside of the processing vessel. Therefore, the gas can usually be spouted toward the exhaust port, and can be spouted toward the inside of the processing vessel in case of emergency in which the fire is caused in the processing vessel. Consequently, the fire caused in the processing vessel can effectively be put out.

According to the sixth aspect of the present invention, one of the inner nozzle member and the outer nozzle member is rotated with respect to the other so that a direction of the jet of the gas is switched. In other words, the nozzle capable of switching the direction of the jet can be implemented with a simple structure.

According to the seventh aspect of the present invention, the control means is provided. The control means serves to control the switching operation of the nozzle in response to the signal output from the sensor for sensing a fire. Therefore, when a fire is caused in the processing vessel, the gas is automatically spouted from the nozzle toward the inside of the processing vessel. In other words, the fire can automatically be put out effectively.

According to the eighth aspect of the present invention, the ordinary temperature gas feeding means and the cooled gas feeding means are connected to the switching valve, and the control means is provided. The control means serves to control the switching valve such that the cooled nonreactive gas is spouted from the nozzle only when the object is put in. Consequently, uniformity of dryness of the object can be enhanced and an amount of the cooled nonreactive gas to be used can be reduced.

According to the ninth aspect of the present invention, two types of the single gas feeding means are connected to the switching valves belonging to the units through the branching pipes. Consequently, a scale of the apparatus can be reduced comparatively and the apparatus can be adapted to a large number of the objects.

According to the tenth aspect of the present invention, the nozzle includes the check valve. Therefore, when the supply of the nonreactive gas is stopped, an inflammable vapor generated from the solvent can be prevented from entering the pipe connected to the nozzle.

According to the eleventh aspect of the present invention, the nonreactive gas feeding means is connected to the nozzle. Therefore, the jet of the nonreactive gas is generated so as to cover the opening of the processing vessel. Accordingly, the cooling coil necessary for the conventional apparatus is not required. Consequently, the defective dryness of the object, the high manufacturing cost and the like which are caused by the cooling coil can be eased or eliminated. In addition, the size of the apparatus can be reduced.

According to the twelfth aspect of the present invention, the cooling means is provided on the pipe inter-connecting the nonreactive gas feeding means to the switching valve. Therefore, the cooled nonreactive gas can be sprayed on the object when putting the object in. Consequently, the uniformity of the dryness of the object can be enhanced.

According to the thirteenth aspect of the present invention, the pan and the pipe are provided. Therefore, when the vapor of the solvent condenses on the surface of the object to be processed and then falls as droplets from the object, the droplets are received by the pan and are discharged to the outside through the pipe. Consequently, it is possible to prevent the solvent stored in the processing vessel from being contaminated by the falling droplets.

According to the fourteenth aspect of the present invention, the apparatus according to any of the first to thirteenth aspects of the present invention is used to perform a drying processing for the object such as a semiconductor wafer, for example. Therefore, the object is exposed to a stable vapor filled into the processing vessel at the drying step. As a result, the defective drabness of the object can be eased or eliminated. Thus, excellent processing results can be obtained.

In order to solve the above-mentioned problems of the prior art, it is an object of the present invention to provide a drying technique to prevent defective dryness and to reduce a size and a cost and perform repair rapidly.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a sectional front view showing an apparatus according to a second embodiment of the present invention;

DESCRIPTION OF THE PREFERRED EMBODIMENTS

1. First Embodiment

First of all, a drying apparatus 101 according to a first embodiment will be described below.

1-1. Structure of Apparatus

Figure 1:
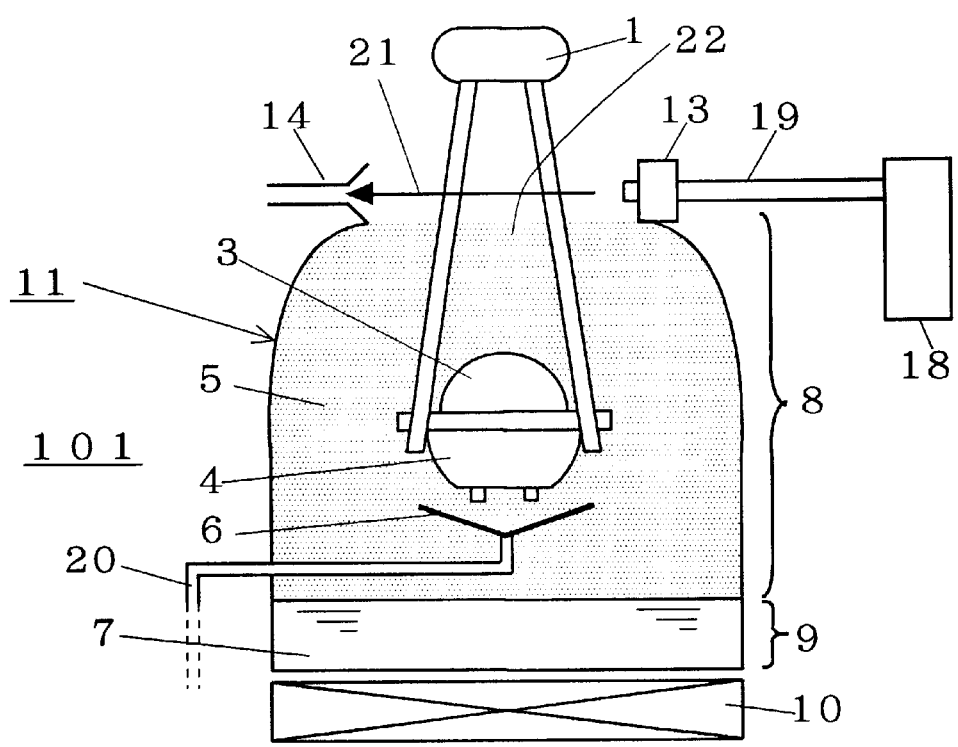
FIG. 1 is a sectional front view showing an apparatus according to a first embodiment of the present invention.
Figure 2:
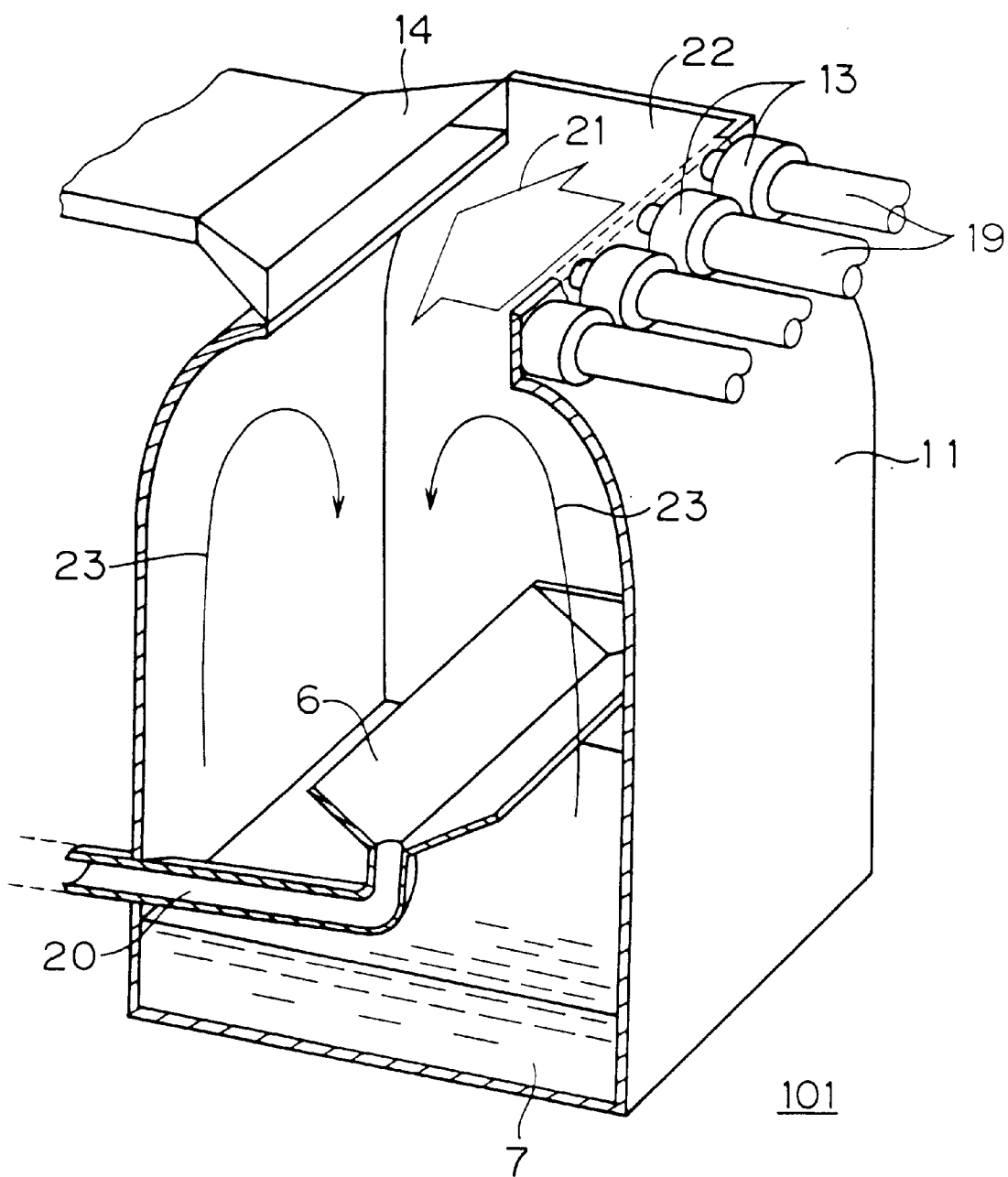
FIG. 2 is a sectional perspective view showing the apparatus according to the first embodiment of the present invention.

FIG. 1 is a sectional front view showing a structure of the drying apparatus 101. FIG. 2 is a sectional perspective view showing the drying apparatus 101. Not only the drying apparatus 101 but also drying apparatus shown in all preferred embodiments are formed to dry a semiconductor wafer 3.

As shown in FIGS. 1 and 2, the drying apparatus 101 comprises a processing vessel 11. The processing vessel 11 is formed as a container having an upper portion opened. In other words, an upward opening 22 is defined in the upper portion of the processing vessel 11. A side wall of the processing vessel 11 is smoothly curved inward as the opening 22 is approached upward in the vicinity of an upper end of the processing vessel 11.

Nozzles 13 arranged in a line and a duct-shaped exhaust member 14 are provided opposite to each other on the upper portion of the processing vessel 11 with the opening 22 interposed therebetween. One of ends of a pipe 19 is connected to each nozzle 13. The other end of the pipe 19 is connected to a nitrogen gas feeder 18. For example, the nitrogen gas feeder 18 is provided as one of plants. An exhaust port defined by the exhaust member 14 is opened opposite to the nozzles 13.

A heater 10 is provided just below a bottom portion of the processing vessel 11. Furthermore, a pan 6 is fixed into a position between the bottom portion and the upper opening 22 in the processing vessel 11. One of ends of the pipe 20 for draining the pan 6 is connected to a bottom portion of the pan 6. The pipe 20 penetrates the side wall of the processing vessel 11 and leads to an outside of the processing vessel 11.

1-2. Operation of Apparatus

The drying apparatus 101 is used in the following manner. First of all, a solvent suitable for drying the rinsed semiconductor wafer 3, for example, an IPA solution 7 is fed into the processing vessel 11. An amount of the IPA solution 7 to be fed is regulated such that a liquid level is positioned below the bottom portion of the pan 6.

A nitrogen gas is fed from the nitrogen gas feeder 11 to the nozzles 13 through the pipes 19. Consequently, the nitrogen gas is spouted from the nozzles 13. Since the nozzles 13 are arranged in at line, the spouted nitrogen gas, that is, a jet 21 of the nitrogen gas becomes film-shaped to cover the whole opening 22. The jet 21 is collected into the exhaust port of the exhaust member 14 opened opposite to the nozzles 13. The exhaust member 14 discharges, to the outside, the jet 21 sucked through the exhaust port.

Furthermore, the heater 10 is charged. As a result, heat generated by the heater 10 is transferred to the IPA solution 7 through the bottom portion of the processing vessel 11. The IPA solution 7 is heated so that it is vaporized. Consequently, an IPA vapor 5 is generated. The IPA vapor 5 is filled into the processing vessel 11. More specifically, an inside of the processing vessel 11 is divided into a liquid storing section 9 in which the IPA liquid 7 is stored and a vapor filling section 8 provided over the liquid storing section 9 for filling the IPA vapor 5.

The IPA vapor 5 is obstructed by the jet 21 of the nitrogen gas transferred from the nozzles 13 to the exhaust port of the exhaust member 14. Consequently, it is difficult to scatter and lose the IPA vapor 5 to the outside of the processing vessel 11 through the opening 22. In other words, most of the IPA vapor 5 remains in the vapor filling section 8. More specifically, the jet 21 functions as a kind of curtain for hindering passage of the gas.

After a state of the IPA vapor 5 filled into the vapor filling section 8 is stabilized, a processing is started for the semiconductor wafer 3 to be processed. After a rinsing processing is completed, a lot of semiconductor wafers 3 and a cassette 4 carrying them are suspended from a holding arm 1 and are inserted from above the opening 22 into the vapor filling section 8 through the opening 22 across the jet 21. The cassette 4 carrying the semiconductor wafers 3 is held by the holding arm 1 just above the pan 6 in the vapor filling section 8.

Then, the IPA vapor 5 filled into the vapor filling section 8 condenses and dissolves into waterdrops which stick to surfaces of the semiconductor wafers 3 and the cassette 4. Since IPA has a high solubility to water, a large amount of the IPA is soluble in the waterdrops. As a result, the waterdrops are essentially changed to IPA droplets so that weights are increased. The IPA droplets slip from the surfaces of the semiconductor wafers 3 and the cassette 4 because of their weights.

Thus, the semiconductor wafers 3 and the cassette 4 which are wet with the waterdrops can be dried. The slipping IPA droplets are collected by the pan 6 and are discharged to the outside through the pipe 20. More specifically, waterdrops and the IPA solution having a small amount of impurities are not mixed with the IPA solution 7 but discharged to the outside of the processing vessel 11. Consequently, a purity of the IPA solution 7 stored in the liquid storing section 9 is kept high.

When a drying processing of the semiconductor wafers 3 and the cassette 4 is completed, the cassette 4 carrying the semiconductor wafers 3 is pulled up by the holding arm 1 and is taken out of the opening 22. Then, the cassette 4 thus taken out is delivered to a next processing step. Thereafter, new (i.e. unprocessed) semiconductor wafers 3 and a new cassette 4 are put into the vapor filling section 8 of the processing vessel 11. Thus, the semiconductor wafers 3 and the cassette 4 are dried repeatedly.

1-3. Advantage of Apparatus

In the drying apparatus 101, a shape of the processing vessel 11 plays an important part such that the jet 21 effectively functions as the curtain. As shown in FIG. 2, the IPA vapor 5 generated from the IPA solution 7 rises along the side wall of the processing vessel 11. As described above, however, the side wall of the processing vessel 11 is smoothly curved inward as the opening 22 is approached in the vicinity thereof.

For this reason, a flow of the IPA vapor 5 is smoothly curved inward along a curved portion of the side wall in the vicinity of the upper portion of the processing vessel 11. The IPA vapor 5 is cooled in the upper portion of the vapor filling section 8 so that the flow of the IPA vapor 5 is linked to a downward flow. In other words, a convection of the IPA vapor 5 is generated in the vapor filling section 8 along a flow 23 shown in FIG. 2.

As a result, the IPA vapor 5 filled into the vapor filling section 8 can effectively be prevented from flowing to the outside through the opening 22 by the jet 21. In the drying apparatus 101, thus, a characteristic shape of the processing vessel 11 effectively enhances the function of the jet 21 acting as the curtail. Consequently, the cooling coil 162 necessary for the drying apparatus 151 according to the prior art is not required by the drying apparatus 101 any more. More specifically, the nozzle 13 and the exhaust member 14 are provided so that the IPA vapor 5 can fully be inhibited from flowing out of the vapor filling section 8 without using the cooling coil 162.

Since the cooling coil 162 is not used, it is possible to eliminate instability of the state of the IPA vapor 165 with a change in the state of a refrigerant fed to the cooling coil 162. In other words, the expansion of the vapor filling section 8, the concentration of the IPA vapor 5 filled into the vapor filling section 8 and the like are stabilized. As a result, the objects to be processed such as the semiconductor wafer 3 and the cassette 4 are dried uniformly and stably. More specifically, problems of defective dryness in the drying apparatus 151 according to the prior art can be eased or solved, and the yield of a semiconductor device manufactured in the semiconductor wafer 3 can be enhanced.

The jet 21 functions to inhibit the IPA vapor 5 from flowing out and to prevent the outside of the processing vessel 11 from affecting the IPA vapor 5 in the vapor filling section 8. A fan for feeding clean air is usually provided above the opening 22 of the processing vessel 11. Consequently, a downward flow of the clean air, that is, a downflow is generated above the opening 22.

In the drying apparatus 101, the jet 21 covers the opening 22 differently from the drying apparatus 151 according to the prior art. Therefore, the downflow does not enter an inside of the vapor filling section 8. Consequently, the IPA vapor 5 filled into the vapor filling section 8 is not disturbed by the downflow, which also contributes to stability of the state of the IPA vapor 5 such as the concentration and expansion of the IPA vapor 5.

As described above, a change in the state of the IPA vapor 5 is inhibited by a double mechanism in the drying apparatus 101. As a result, the defective dryness can be relieved or eliminated. Furthermore, since the cooling coil 162 is not used, it is not necessary to perform complicated control of a temperature of the refrigerant, a flow thereof and the like which is required to keep the IPA vapor 5. In other words, it is also possible to obtain an advantage that the drying apparatus can operate easily.

Since the cooling coil 162 is not used, an upper layer portion of the processing vessel 11 required to place the cooling coil 162 can be reduced. In other words, it is also possible to obtain all advantage that a size of the apparatus can be reduced. In addition, the cooling coil 162 using quartz is not necessary. Therefore, a structure of the apparatus is simple, and a manufacturing cost, a period necessary for repair and a repair cost can be reduced.

While an example in which the IPA is used as a solvent to be stored in the processing vessel 11 has been described, other solvents suitable for drying the rinsed objects may be used. In general, it is possible to use an organic solvent having a lower boiling point than that of water, a lower latent heat of vaporization than that of the water and a high solubility to the water. For example, TFEA (trifluoroethyl alcohol), HFIPA (hexafluoroisopropyl alcohol), PFPA (pentafluoropropyl alcohol) and the like are suitable.

While an example in which the nitrogen gas is used as a gas to be fed to the nozzle 13 through the pipe 19 has been described, other kinds of gases such as chemically stable gases, that is, nonreactive gases may generally be used. For example, an inert gas such as an argon gas may be used. The nitrogen gas is the most inexpensive of all nonreactive gases, and is easily available.

While an example in which the nozzles 13 are arranged in a line so that the jet 21 for covering the opening 22 like a film is generated has been described, a single nozzle capable of generating the film-shaped jet 21 may be provided in place of the nozzles 13 arranged in a line.

2. Second Embodiment

FIG. 3 is a sectional front view showing a structure of a drying apparatus according to a second embodiment. A drying apparatus 102 is characteristically different from the drying apparatus 101 in that a cap 15 for freely covering an opening 22 is provided. In order for the cap 15 to be freely (i.e. removably) put on or taken off, an actuator 24 is coupled to the cap 15 as shown in FIG. 3, for example. The actuator 24 causes the cap 15 to move horizontally in response to a signal sent from a controller (not shown) and to be put on or taken off.

Since the cap 15 which can freely be put on or taken off is provided, the opening 22 can be blocked by the cap 15 when the drying apparatus 102 does not operate, when operation is being prepared or when a semiconductor wafer 3 and a cassette 4 are not put into a processing vessel 11 during the operation. For these periods, the opening 22 is blocked bed the cap 15. Therefore, it is not necessary to feed a nitrogen gas to a nozzle 13.

Immediately before the semiconductor wafer 3 and the cassette 4 are put in during the operation of the drying apparatus 102, a supply of the nitrogen gas to the nozzle 13 is started so that a curtain can be formed by a jet 21 and the cap 15 can be taken off. In this case, it is preferable that the cap 15 should be taken off immediately after the curtain is formed by the jet 21.

Immediately after a drying processing is completed and the semiconductor wafer 3 and the cassette 4 are pulled up, the cap 15 can be put on and the supply of the nitrogen gas to the nozzle 13 can be stopped. In this case, it is preferable that the supply of the nitrogen gas should be stopped immediately after the cap 15 is put on.

The drying apparatus 102 can operate in the above-mentioned manner, thereby reducing an amount of the nitrogen gas to be used without damaging the stability of a state of an IPA vapor 5. In large scale mass-production plants, a cost of the nitrogen gas to be used cannot be neglected. In addition, a period for which the nozzle 13 operates is shortened. Consequently, wear of the nozzle 13 can be reduced so that a life of the apparatus can be prolonged.

3. Third Embodiment

A drying apparatus according to a third embodiment will be described below.

3-1. Structure and Operation of Whole Apparatus

Figure 4:
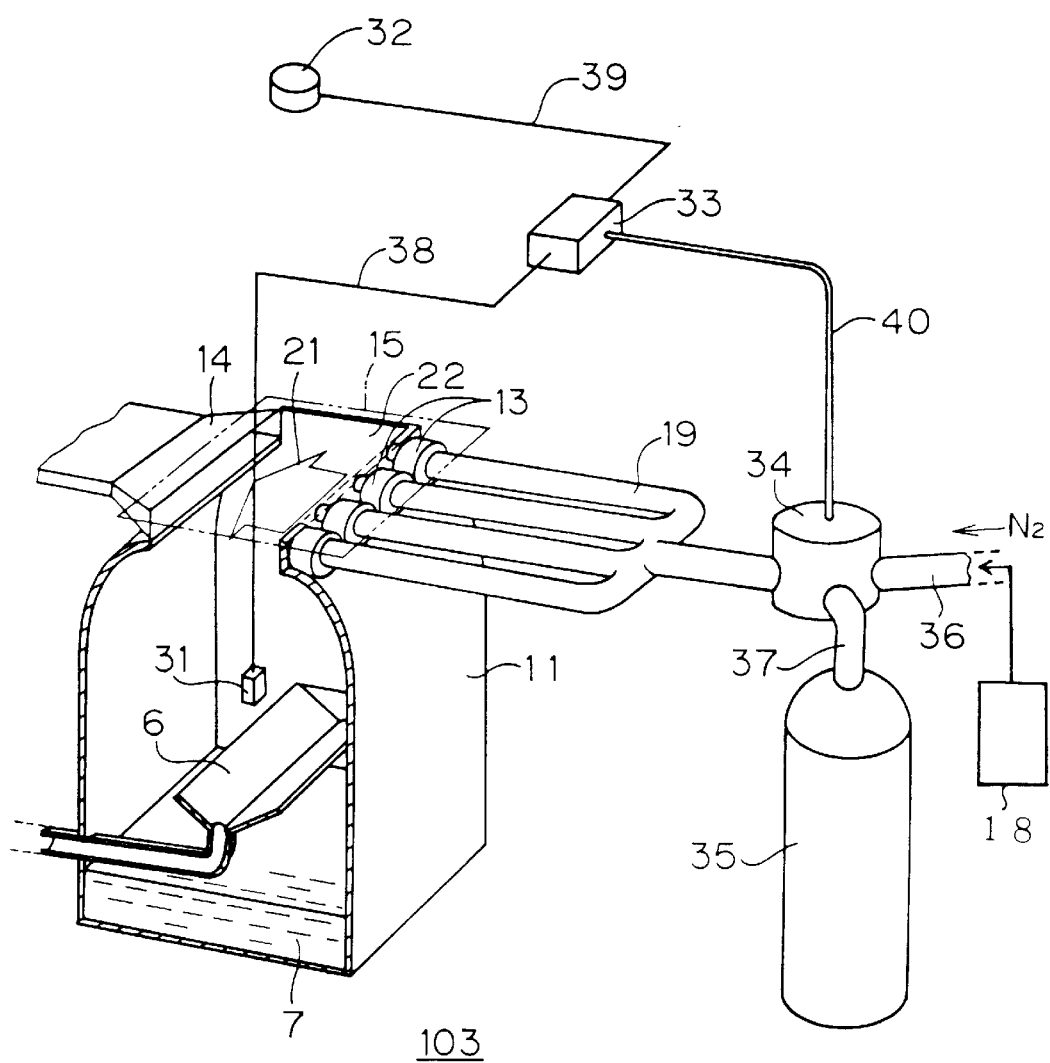
FIG. 4 is a sectional perspective view showing an apparatus according to a third embodiment of the present invention.

FIG. 4 is a sectional perspective view showing a structure of the drying apparatus according to the present embodiment. A drying apparatus 103 is characteristically different from the drying apparatus 102 in that a nozzle 13 is also used as the fire extinguishing nozzle 172 provided in the drying apparatus 151 according to the prior art.

As shown in FIG. 4, a plurality of pipes 19 having respective ends connected to a plurality of nozzles 13 communicate with a common end. The common end is connected to an output of a switching valve 34. The switching valve 34 includes one output and two inputs. The switching valve 34 selects one of the two inputs to be connected to the output.

A nitrogen gas feeder 18 for feeding a nitrogen gas is connected to one of the inputs through a pipe 36. Furthermore, a fire extinguishing gas feeder 35, for example, a gas cylinder for feeding a fire extinguishing gas such as carbon dioxide is connected to the other input through a pipe 37. More specifically, the switching valve 34 has the function of selecting either the nitrogen gas fed from the nitrogen gas feeder 18 or the fire extinguishing gas fed from the fire extinguishing gas feeder 35 and of sending the same to the pipe 19. During normal operation, the switching valve 34 selects the pipe 36 for delivering the nitrogen gas fed from the nitrogen gas feeder 18 and causes the pipe 36 to communicate with the pipes 19.

A heat sensor 31 is provided in a processing vessel 11. A flame sensor 32 is provided above an opening 22. When a fire is caused in the processing vessel 11 so that an internal temperature of the processing vessel 11 is increased, the heat sensor 31 outputs a predetermined signal. This signal is sent to a controller 33 through a signal line 38.

The flame sensor 32 detects that a flame is generated, for example, through infrared rays, and outputs a predetermined signal. This signal is sent to the controller 33 through a signal line 39. The controller 33 sends a driving signal to the switching valve 34 through a signal line 40 on receipt of at least one of the signals sent from the heat sensor 31 and the flame sensor 32.

The switching valve 34 switches a pipe to communicate with the pipe 19 from the pipe 36 to the pipe 37 on receipt of the driving signal. As a result, the fire extinguishing gas is fed from the fire extinguishing gas feeder 35 to the nozzles 13 through the pipe 37, the switching valve 34 and the pipes 19. Then, the fire extinguishing gas is spouted from the nozzles 13 in place of the nitrogen gas. Thus, the fire caused in the processing vessel 11 can automatically be put out.

Not only the nitrogen gas but also the fire extinguishing gas is fed from the nozzles 13. Therefore, the fire extinguishing nozzle 172 provided in the drying apparatus 151 according to the prior art is not required separately. In other words, a structure of the apparatus can be simplified and a manufacturing cost of the apparatus can be reduced. In addition, the processing vessel 11 does not need such an extra size as to place the fire extinguishing nozzle 172. Consequently, a size of the apparatus can be reduced still more.

3-2. Preferred Form of Nozzle

Figure 5:
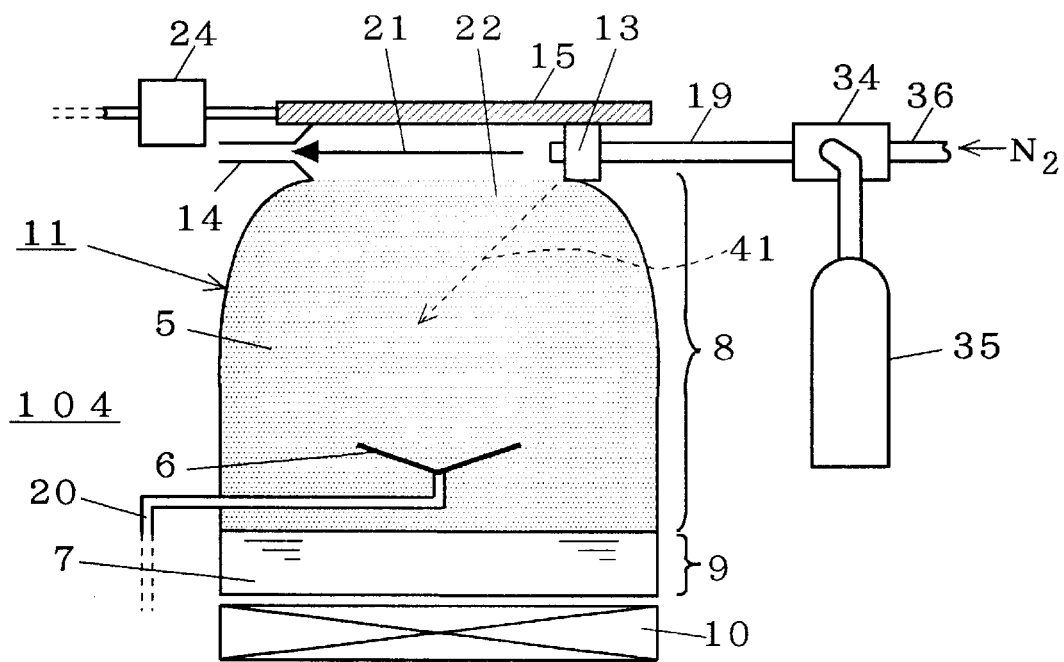
FIG. 5 is a sectional perspective view showing another example of the apparatus according to the third embodiment of the present invention.

FIG. 5 is a sectional front view showing a drying apparatus in which a nozzle 13 has a more preferred structure. A drying apparatus 104 is characterized in that a direction of a jet 41 of a fire extinguishing gas is different from that of a jet 21 of a nitrogen gas. More specifically, the nozzle 13 is provided with a moving mechanism which interlocks with operation of a switching valve 34. The nitrogen gas is spouted such that the jet 21 is spouted toward an exhaust port of an exhaust member 14. The fire extinguishing gas is spouted such that the jet 41 is spouted toward an inside of a processing vessel 11, that is, directly toward a portion where a fire is being caused. Accordingly, the fire caused in the processing vessel 11 can effectively be put out.

Figure 6:
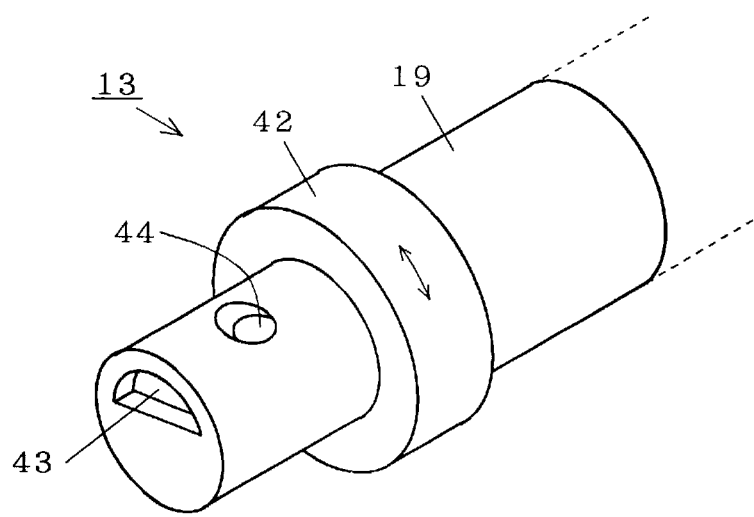
FIG. 6 is a perspective view showing an external appearance of a nozzle of the apparatus in FIG. 5.

FIG. 6 is a perspective view showing an external appearance of the nozzle 13 provided in the drying apparatus 104. The nozzle 13 has a cylindrical outer nozzle member 42 rotatably fixed to a tip portion of the pipe 19. An opening 43 is formed in a portion decentered from a tip portion corresponding to a bottom portion of the outer nozzle member 42. Another opening 44 is formed in a part of a side wall. The opening 44 is positioned on such a side of the side wall as to approach the opening 43 formed on a side wall.

Figure 7:
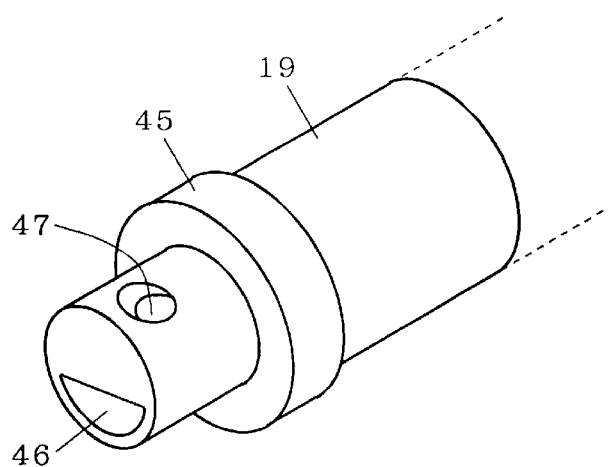
FIG. 7 is a perspective view showing an external appearance of a part of the nozzle in FIG. 6.

FIG. 7 is a perspective view showing an external appearance of the nozzle 13, in which the outer nozzle member 42 is removed. A cylindrical inner nozzle member 45 is fixed to the tip portion of the pipe 19. The outer nozzle member 42 is rotatably engaged with an outside of the inner nozzle member 45. The outer nozzle member 42 is engaged with the inner nozzle member 45 so as to tightly come in contact therewith and cover a surface thereof. An opening (outlet) 46 is formed in a portion decentered from a tip portion corresponding to a bottom portion of the inner nozzle member 45. Another opening (outlet) 47 is formed in a part of a side wall. The opening 47 is positioned opposite to such a side of the side wall as to approach the opening 46.

Figure 8:
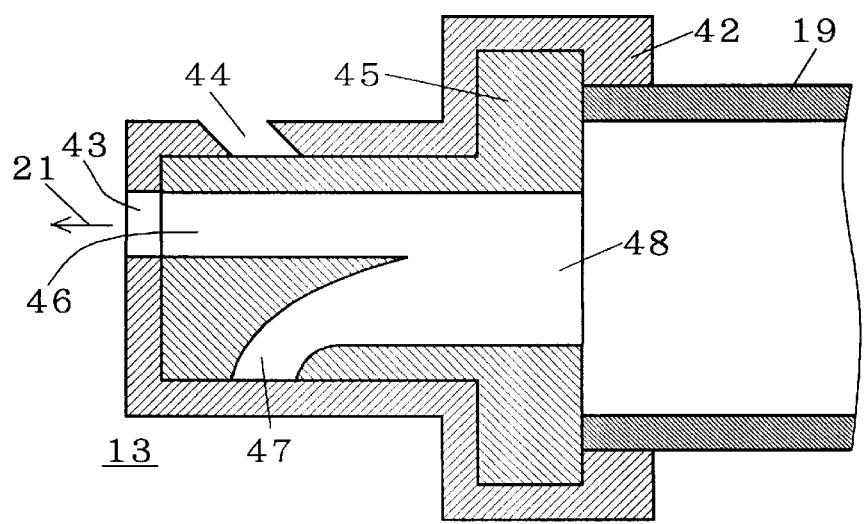
FIG. 8 is a sectional view showing the nozzle in FIG. 6.

FIG. 8 is a sectional view showing the nozzle 13 with the nitrogen gas spouted. The inner nozzle member 45 is fixed such that the opening 47 is turned toward an inside of the processing vessel 11, that is, downward. An inside of the pipe 19 communicates with a path 48 formed in the inner nozzle member 45. A tip portion of the path 48 branches off into two paths. These branch paths communicate with the openings 46 and 47, respectively.

The branch path communicating with the opening 46 is provided along a center axis of the inner nozzle member 45. The branch path communicating with the opening 47 is gently curved so as to gradually diverge from a direction of the center axis. In the opening 47, this branch is turned in an intermediate direction between a direction toward the tip portion of the outer nozzle member 42 and a radial direction, that is, obliquely downward.

When spouting the nitrogen gas, a rotary position of the outer nozzle member 42 is set to a position where the openings 43 and 46 overlap each other. At this time, the openings 44 and 47 are positioned opposite to each other. The opening 47 is blocked by the side wall of the outer nozzle member 42. Accordingly, the nitrogen gas fed bay means of the pipe 19 is spouted as the jet 21 toward the exhaust port of the exhaust member 14 through the opening 43.

Figure 9:
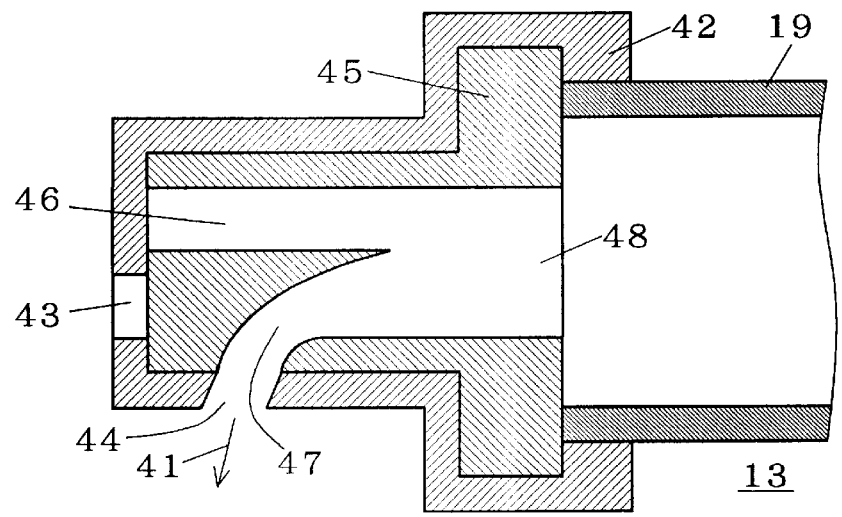
FIG. 9 is a sectional view showing the nozzle in FIG. 6.

FIG. 9 is a sectional view showing the nozzle 13 with the fire extinguishing gas spouted. When spouting the fire extinguishing gas, the rotary position of the outer nozzle member 42 is set to a position rotated at an angle of 180° to the position in FIG. 8, that is, a position where the openings 44 and 47 overlap each other. At this time, the openings 43 and 46 are set in a rotary symmetrical position with a center of the tip portion as a symmetry axis. The opening 46 is blocked by the tip portion of the outer nozzle member 42. Accordingly, the fire extinguishing gas fed bay means of the pipe 19 is spouted as the jet 41 toward the inside of the processing vessel 11 obliquely downward through the opening 44.

Figure 10:
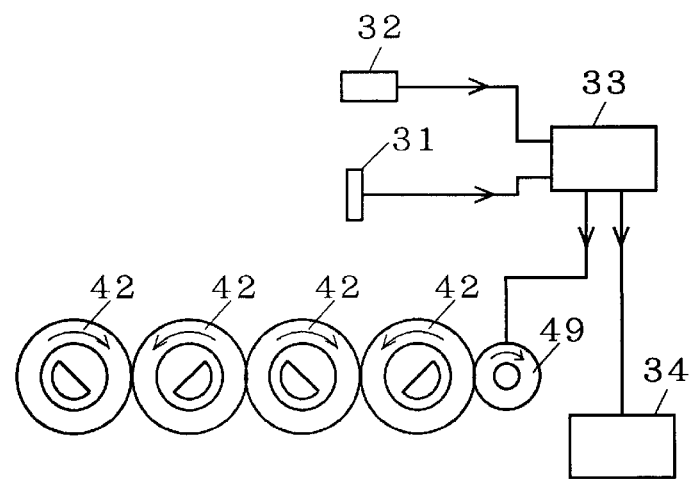
FIG. 10 is a view showing a driving mechanism of the nozzle in FIG. 6.

FIG. 10 is a view showing an example of a driving mechanism for rotating the outer nozzle member 42. In this example, gears are formed on an outer periphery of a flange portion of the outer nozzle member 42. The gears are engaged with each other between the nozzles 13 arranged in a line. Furthermore, gears of a driving section 49 including a motor are engaged with the gears of one of the nozzles 13, for example.

When sending a driving signal to the switching valve 34, the controller 33 also sends the driving signal to the driving section 49 at the same time. The driving section 49 rotates and drives the gears on receipt of the driving signal. As a result, the outer nozzle members 42 provided on the nozzles 13 arranged in a line are rotated simultaneously. The rotating and driving operation is performed until the outer nozzle members 42 are rotated at an angle of 180°. Thus, the nozzle 13 is shifted to a state in which the fire extinguishing gas can be spouted interlockingly with the switching valve 34.

FIG. 10 shows an example in which the outer nozzle members 42 are driven. Another driving mechanism can be employed. For example, the driving sections 49 can individually be provided in the nozzles 13 arranged in a line. It is also possible to employ a driving mechanism using no gear which is different from the driving section 49. Furthermore, even if the outer nozzle member 42 is fixed and the inner nozzle member 45 can be rotated freely, the same effects can be obtained.

In the drying apparatus 104, the jet 41 is turned toward the inside of the processing vessel 11 differently from the drying apparatus 103. Therefore, it is not necessary to use the fire extinguishing gas such as carbon dioxide separately. More specifically, in FIG. 4, it is possible to have a structure in which the fire extinguishing gas feeder 35 and the switching valve 34 are not provided but the nitrogen gas is fed to the pipe 19 even when a fire is caused. At this time, the controller 33 sends the driving signal to only the driving section 49. In other words, the fire can effectively be put out in the drying apparatus 104 and a structure of the drying apparatus 104 can be simplified more.

3-3. Apparatus comprising Processing Vessels

Figure 11:
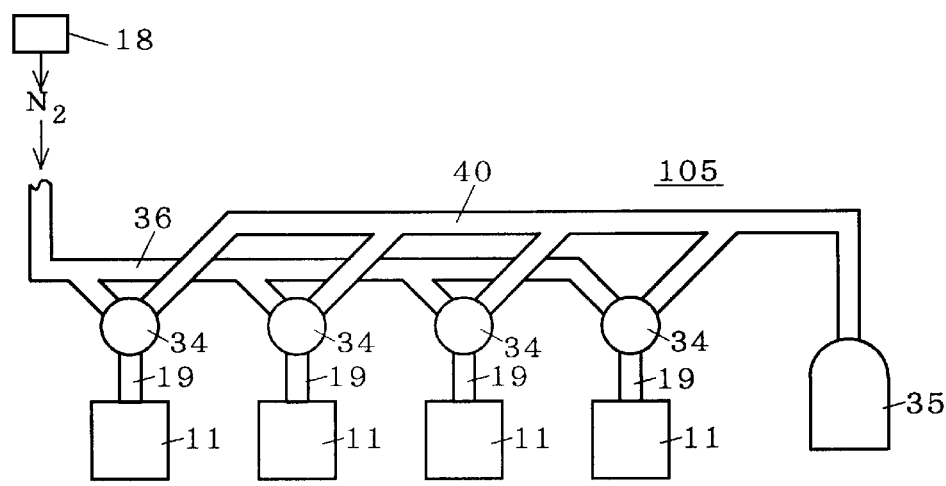
FIG. 11 is a schematic view showing yet another example of the apparatus according to the third embodiment of the present invention.

FIG. 11 is a schematic view simply showing an example of a drying apparatus comprising a plurality of processing vessels 11 provided in the drying apparatus 103 or 104. The same numbers or lines of heaters 10, nozzles 13 and other portions are attached to the processing vessels 11 corresponding to the processing vessels 11, which are not shown. More specifically, a plurality of units are provided, each unit including a single processing vessel 11, a single heater 10, a line of nozzles 13 and the like.

As shown in FIG. 11, the same number of switching valves 34 are also set corresponding to the processing vessels 11. In other words, the switching valve 34 is also included in the unit. The switching valves 34 are respectively connected, through the pipes 19, to the nozzles 13 arranged in a plurality of lines which are attached to the processing vessels 11. More specifically, each of the portions from the switching valves 34 to the processing vessels 11 is identical to each of corresponding portions in the drying apparatus 103 or 104.

A pipe 36 for feeding a nitrogen gas to one of inputs of each switching valve 34 has one main pipe and a plurality of branch pipes. The main pipe is connected to a nitrogen gas feeder 18, for example, an equipment provided in a plant for feeding the nitrogen gas. Each branch pipe is connected to one of the inputs of each switching valve 34.

Similarly, a pipe 40 for feeding a fire extinguishing gas to the other input of each switching valve 34 has one main pipe and a plurality of branch pipes. The main pipe is connected to a fire extinguishing gas feeder 35. Each branch pipe is connected to the other input of each switching valve 34. The switching valve 34 selects the pipe 36 for delivering the nitrogen gas and causes the pipe 36 to communicate with the pipe 19 during normal operation, and selects the pipe 40 for delivering the fire extinguishing gas when a fire is caused. In these respects, the drying apparatus 105 is the same as the drying apparatus 103 and 104.

The drying apparatus 105 has the above-mentioned structure. Therefore, it is not necessary to increase the number of the fire extinguishing gas feeders 35 corresponding to that of the processing vessels 11. In the same manner as in the drying apparatus 103 and 104, at least one fire extinguishing gas feeder 35 is enough. Similarly, one nitrogen gas feeder 18 is enough. Thus, although the drying apparatus 105 comprises a plurality of processing vessels 11 and is adapted to a mass processing of the semiconductor wafers 3, a scale of the fire extinguishing gas feeder 35 or the like can be reduced comparatively. Consequently, the whole apparatus can be simplified and a size thereof can be reduced. In addition, a manufacturing cost can be reduced.

4. Fourth Embodiment

Figure 12:
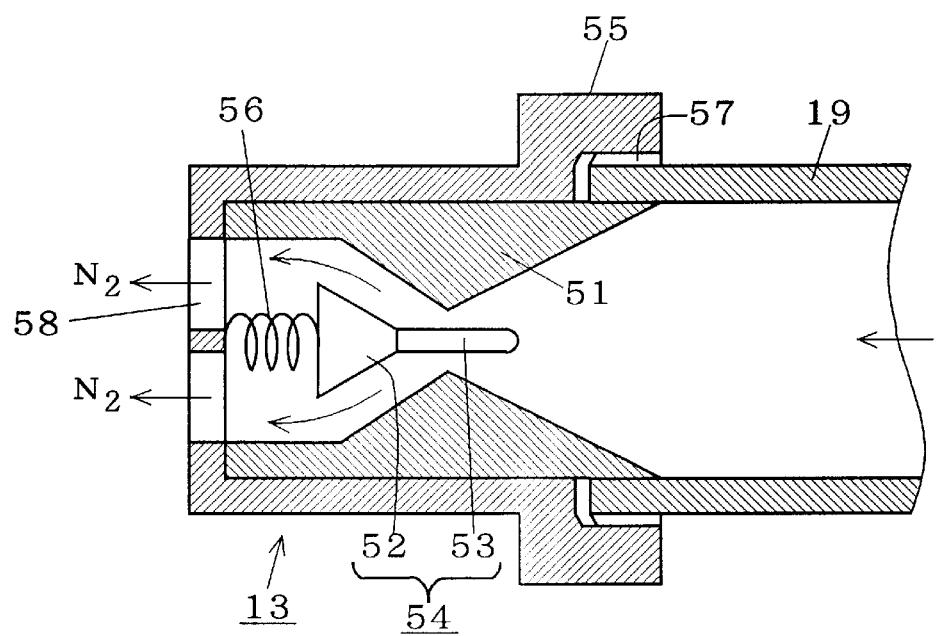
FIG. 12 is a sectional view showing a nozzle of an apparatus according to a fourth embodiment of the present invention.

FIG. 12 is a sectional view showing a structure of a nozzle 13 provided in a drying apparatus according to a fourth embodiment. The drying apparatus is characteristically different from the drying apparatus 101 or 102 in that the nozzle 13 includes a check valve as shown in FIG. 12.

The nozzle 13 has an inner nozzle member 51 provided on a tip portion of a pipe 19. The inner nozzle member 51 includes a throttling section. An inside diameter of the throttling section is gradually reduced when a tip portion of the nozzle 13 is approached along a center axis, and is gradually increased when a minimum diameter is passed. An outer nozzle member 55 is engaged with an outside of the inner nozzle member 51. For example, the outer nozzle member 55 is fixed to the pipe 19 with a screw 57.

The outer nozzle member 55 is cylindrical, and has an opening 58 formed on a bottom portion thereof. Furthermore, one of ends of a spring 56 is fixed to the bottom portion. A moving plug 54 is coupled to the other end of the spring 56. The moving plug 54 has a conical body 52 and a guide shaft 53 provided on a vertex portion thereof. In other words, the moving plug 54 is attached to the outer nozzle member 55 through the spring 56.

The guide shaft 53 is a bar-shaped body having such a size as to be inserted, with sufficient play, into a portion having a minimum inside diameter of the inner nozzle member 51. The guide shaft 53 has such a length as to be inserted into the portion having the minimum inside diameter of the inner nozzle member 51 even if the spring 56 shrinks to a maximum. A diameter of a bottom face of the conical body 52 is set greater than the minimum inside diameter of the inner nozzle member 51.

For this reason, when the spring 56 stretches by restoring force, the conical body 52 comes in contact with an internal wall of the inner nozzle member 51. As a result, a path of a gas fed through the pipe 19 is blocked. When the spring 56 shrinks, the conical body 52 gets away from the internal wall of the inner nozzle member 51 so that the path is opened.

At this time, the guide shaft 53 is always inserted into the portion having the minimum inside diameter of the inner nozzle member 51. Therefore, a position of the moving plug 54 is kept within a constant range. Consequently, a gas flow between the inner nozzle member 51 and the moving plug 54 is not disturbed. Furthermore, the moving plug 54 can smoothly open and block the path.

When the nitrogen gas or the fire extinguishing gas is fed through the pipe 19, the moving plug 54 is pushed out in a direction of the flow by force of the gas so that the path is opened between the moving plug 54 and the inner nozzle member 51. As a result, the gas is spouted to an outside of the nozzle 13 through the opening 58. A strength of the spring 56 is set such that the moving plug 54 can easily open the path by the force of the gas.

When neither the nitrogen gas nor the fire extinguishing gas is fed through the pipe 19, the conical body 52 comes in contact with the internal wall of the inner nozzle member 51 by the restoring force of the spring 56. Therefore, the path between the moving plug 54 and the inner nozzle member 51 is blocked. Consequently, an IPA vapor 5 filled into a processing vessel 11 can be prevented from entering the pipe 19 through the nozzle 13. By adding a simple structure to the nozzle 13, unexpected damages can be prevented from being caused by an inflammable gas such as the IPA vapor 5 unnecessarily entering each portion of the apparatus or a plant.

Figure 13:
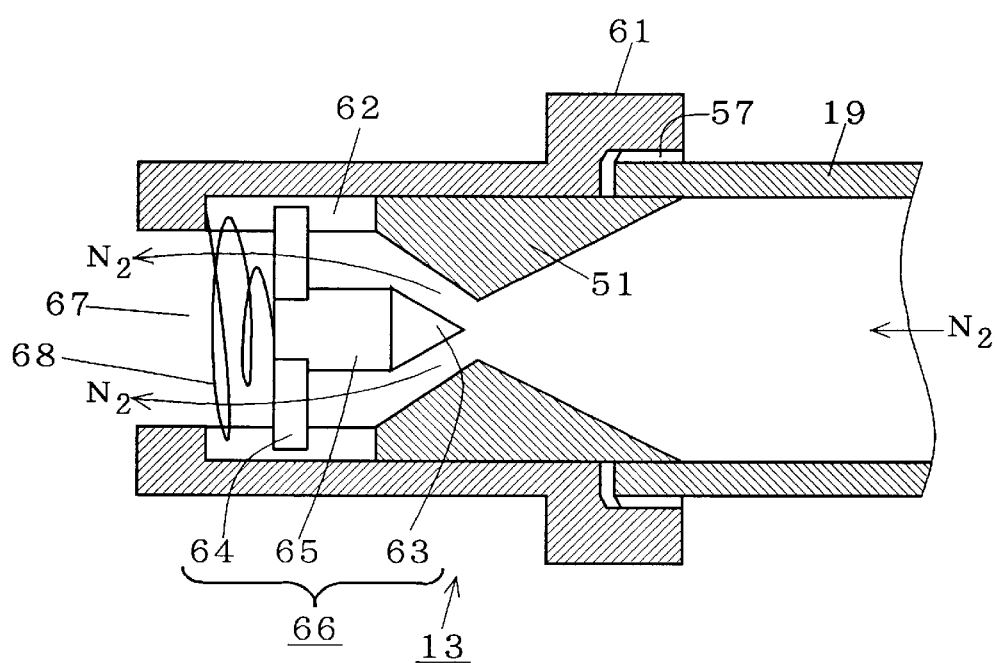
FIG. 13 is a sectional view showing another example of the nozzle of the apparatus according to the fourth embodiment of the present invention.

A structure of the check valve provided in the nozzle 13 is not restricted to the example shown in FIG. 12. FIG. 13 is a sectional view showing another example of the structure of the check valve provided in the nozzle 13. In the same manner as in the example of FIG. 12, the nozzle 13 also has an inner nozzle member 51 provided on a tip portion of a pipe 19. The inner nozzle member 51 has a throttling portion. An outer nozzle member 61 is engaged with an outside of the inner nozzle member 51.

Similarly, a moving plug 66 having a conical body 63 is attached to the outer nozzle member 61 through a spring 68. In addition, a shape of the conical body 63 is set in such a manner that a side wall of the conical body 63 comes in contact with an internal wall of the inner nozzle member 51 to block a path of a gas when the spring 68 stretches.

The nozzle 13 shown in FIG. 13 is characteristically different from the nozzle 13 shown in FIG. 12 in that the moving plug 66 does not include the guide shaft 53 and is slidably supported by a trench 62 formed on an internal wall of the outer nozzle member 61, thus keeping its position. The outer nozzle member 61 is cylindrical, and has an opening 67 formed as a gas outlet on a bottom portion thereof.

Furthermore, at least two trenches 62 which are symmetrical around a center axis are formed on an inner face of the side wall so as to extend along the center axis. The moving plug 66 further includes a shaft 65 and a projection 64 in addition to the conical body 63. The shaft 65 is integrally coupled to the conical body 63. The projection 64 projects from the shaft 65 toward the trench 62. A tip portion of the projection 64 is slidably engaged with the trench 62.

More specifically, the projection 64 is slidably guided by the trench 62 so that a position of the moving plug 66 is kept within a constant range. When the nitrogen gas or the fire extinguishing gas is fed through the pipe 19, the path is opened between the moving plug 66 and the inner nozzle member 51 by the force of the gas. When neither of the gases is fed, the same operation of blocking the path as that of the nozzle 13 shown in FIG. 12 is performed. Consequently, the IPA vapor 5 can be prevented from entering the pipe 19 through the nozzle 13 in the same manner as in the nozzle 13 shown in FIG. 12.

5. Fifth Embodiment

Figure 14:
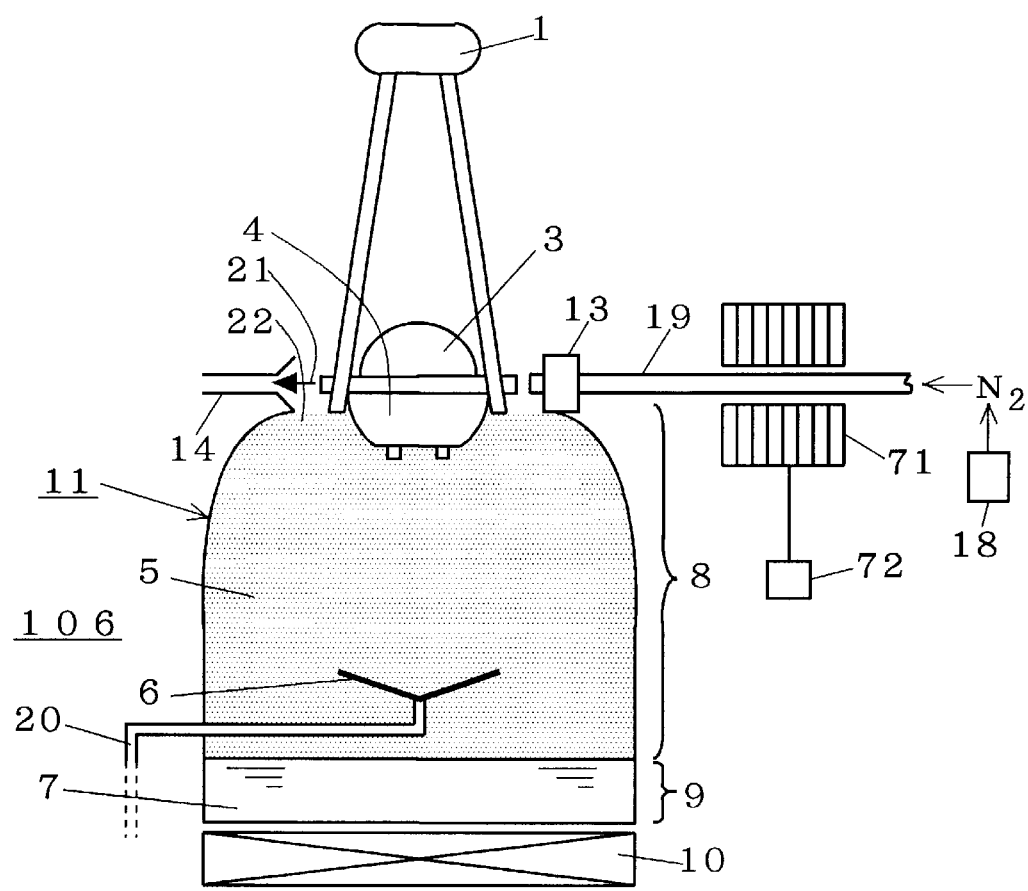
FIG. 14 is a sectional front view showing an apparatus according to a fifth embodiment of the present invention.

FIG. 14 is a sectional front view showing a structure of a drying apparatus according to a fifth embodiment. A drying apparatus 106 is characteristically different from the drying apparatus according to the first to fourth embodiments in that a cooler 71 for cooling a nitrogen gas flowing through a pipe 19 is provided in a part of the pipe 19. For example, an electronic thermal element, a water-cooling mechanism, an air-cooling mechanism or the like is used for the cooler 71. A controller 72 is connected to the cooler 71 through a signal line.

As shown in FIG. 14, when a cassette 4 carrying semiconductor wafers 3 is suspended from a holding arm 1 and is inserted into an opening 22 across a jet 21 from above a processing vessel 11 after rinsing, the nitrogen gas spouted as the jet 21 has been cooled to have a lower temperature than an ordinary temperature by operation of the cooler 71. More specifically, the semiconductor wafers 3 and the cassette 4 are exposed to the jet 21 of the cooled nitrogen gas when they are inserted into the opening 22.

As a result, the semiconductor wafers 3 and the cassette 4 which have surfaces wet with waterdrops are forcedly cooled so that their temperatures are unified. Then, the semiconductor wafers 3 and the cassette 4 pass through the opening 22 and are held in a predetermined position in a vapor filling section 8. Thus, a drying processing using an IPA vapor 5 is started. In this case, the semiconductor wafers 3 and the cassette 4 have a uniform temperature. Therefore, the IPA vapor 5 uniformly condenses on the surfaces of the semiconductor wafers 3 and the cassette 4. As a result, the whole surfaces are dried evenly. Consequently, so-called dry spots are caused with difficulty. In other words, defective dryness can further be inhibited from being caused.

The controller 72 regulates a time to turn on and off the cooler 71 such that the sufficiently cooled nitrogen gas can be spouted as the jet 21 when the semiconductor wafers 3 and the cassette 4 are put in. For example, the cooler 71 is turned on a little earlier than the operation of putting new semiconductor wafers 3 and a new cassette 4 in. Consequently, the nitrogen gas forming the jet 21 is sufficiently cooled in advance. For example, the controller 72 can control the cooler 71 corresponding to movement of the cassette 4 on receipt of a signal sent from a control unit (not shown) for controlling motion of the holding arm 1.

After the semiconductor wafers 3 and the cassette 4 pass through the opening 22 and are inserted into the processing vessel 11, the cooler 71 is returned to an OFF-state, for example. Thus, the defective dryness can be inhibited from being caused and unnecessary cooling operation can be reduced. If the unnecessary cooling operation does not matter, the drying apparatus 106 can have a structure in which the controller 72 is not provided and the cooler 71 is always kept in an ON-state during operation of the drying apparatus 106.

Figure 15:
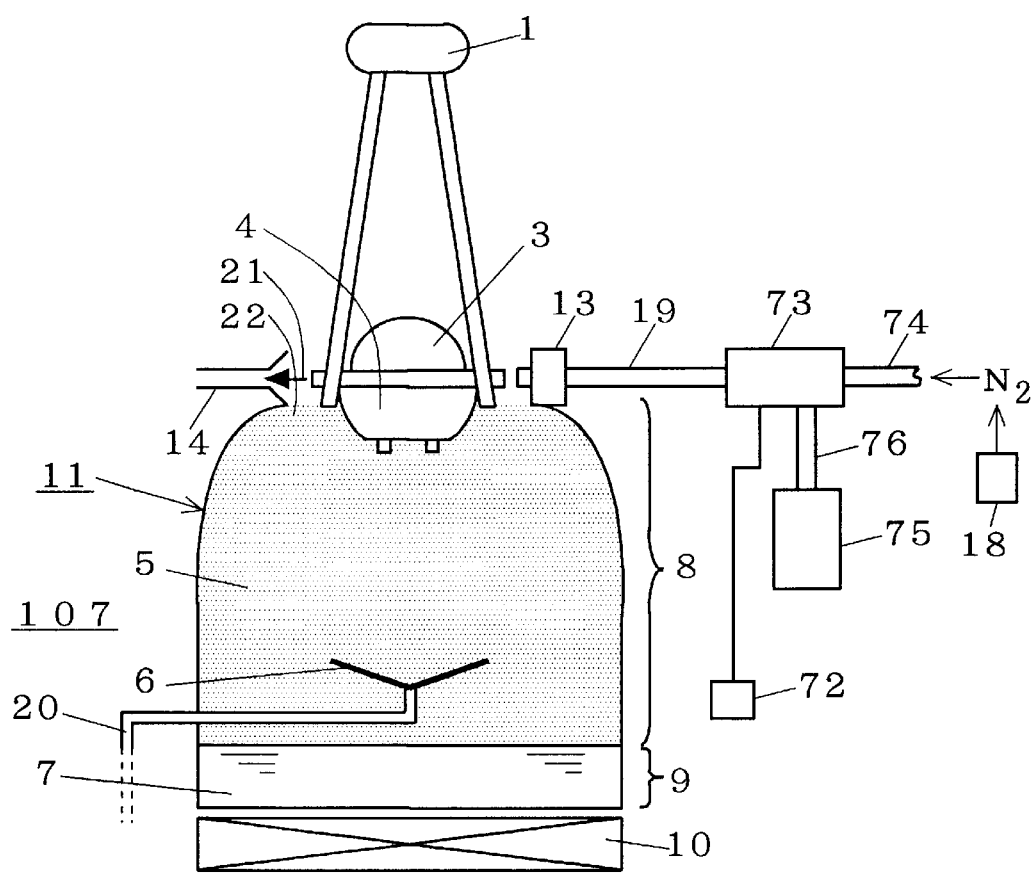
FIG. 15 is a sectional front view showing another example of the apparatus according to the fifth embodiment of the present invention.
Figure 16:
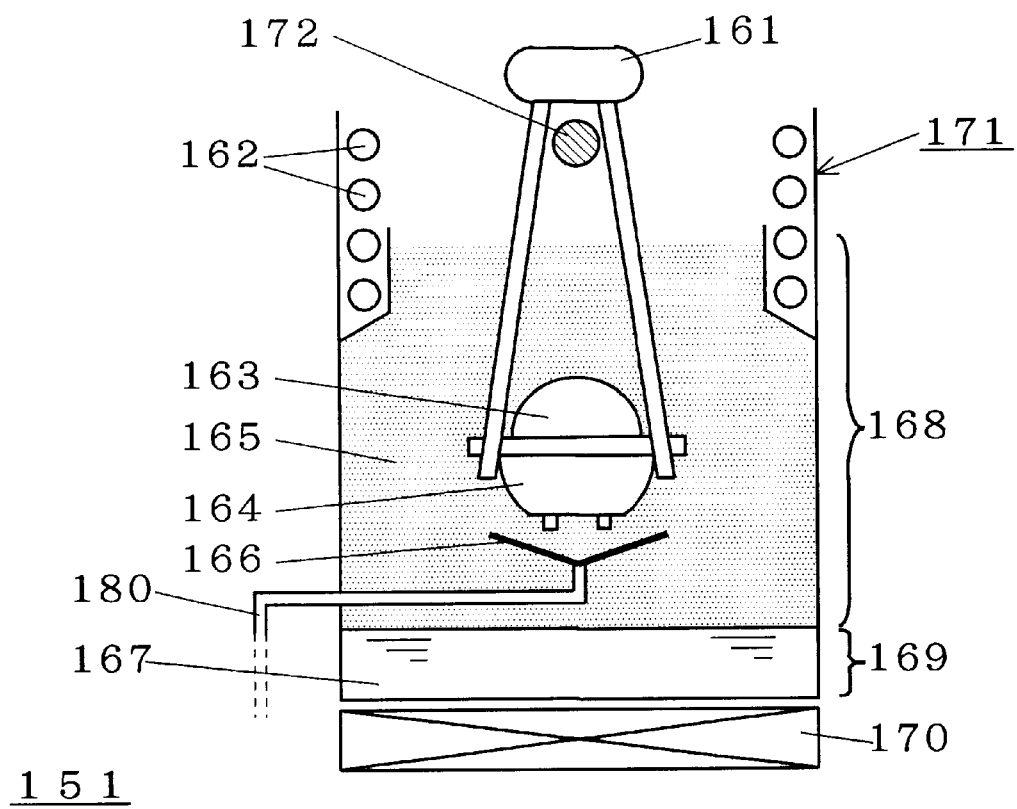
FIG. 16 is a sectional front view showing an apparatus according to the prior art.

While the drying apparatus 106 has been formed so as to cool the nitrogen gas flowing through the pipe 19, the same effects can be obtained by such a structure as to feed a preliminarily cooled nitrogen gas to the pipe 19. FIG. 15 is a sectional front view showing a structure of a drying apparatus having such a structure.

In a drying apparatus 107, an output of a switching valve 73 is connected to a pipe 19 in the same manner as in the drying apparatus 103 of FIG. 4. A nitrogen gas feeder 18 for feeding a nitrogen gas having an ordinary temperature is connected to one of two inputs of the switching valve 73 through a pipe 74. A cooled nitrogen gas feeder 75 for feeding a cooled nitrogen gas is connected to the other input of the switching valve 73 through a pipe 76. A controller 72 is further connected to the switching valve 73 through a signal line.

When the nitrogen gas having, the ordinary temperature should be spouted as a jet 21, the switching valve 73 selects the pipe 74 for delivering the nitrogen gas having the ordinary temperature and causes the pipe 74 to communicate with the pipe 19 so that the nitrogen gas having the ordinary temperature is fed to a nozzle 13. When the cooled nitrogen gas should be spouted as the jet 21, the switching, valve 73 selects the pipe 76 for delivering the cooled nitrogen gas and causes the pipe 76 to communicate with the pipe 19 so that the cooled nitrogen gas is fed to the nozzle 13. Switching operation performed by the switching valve 73 is controlled by the controller 72.

As described above, the drying apparatus 107 also has such a structure that the nitrogen gas having the ordinary temperature and the cooled nitrogen gas are selectively spouted as the jet 21. Therefore, defective dryness can be prevented and an amount of the cooled nitrogen gas to be used can be reduced in the same manner as in the drying apparatus 106.

In the same manner as in FIG. 11, the drying apparatus 107 can have such a structure that a plurality of processing vessels 11 are provided to share the nitrogen gas feeder 18 and the cooled nitrogen gas feeder 75. Consequently, a scale of the cooled nitrogen gas feeder 75 or the like can be reduced comparatively and a mass processing of the semiconductor wafers 3 can be performed.

Furthermore, it is possible to form a drying apparatus by combining the drying apparatus 107 with the drying apparatus 103 shown in FIG. 4. More specifically, the switching valve 73 can be replaced with a 3-input switching valve. The nitrogen gas feeder 18 can be connected to a first input, the cooled nitrogen gas feeder 75 can be connected to a second input, and the fire extinguishing gas feeder 35 can be connected to a third input. During normal operation, the first and second inputs are switched by operation of the controller 72. In case of emergency in which a fire is detected by the heat sensor 31 or the flame sensor 32, switching to the third input is performed by operation of the controller 33.

While the invention has been described in detail, the foregoing description is in all aspects illustrative and not restrictive. It is understood that numerous other modifications and variations can be devised without departing from the scope of the invention.

We claim:

1. A drying apparatus for storing and heating a water-soluble solvent, and causing a vapor generated from said solvent to condense on a surface of an object to be processed, thereby drying said surface of said object, comprising:
    a container-shaped processing vessel defining an upward opening on a top thereof and capable of storing said solvent;
    a heater capable of heating said solvent stored in said processing vessel; and
    a nozzle and exhaust device provided opposite to each other with said opening interposed therebetween,
    wherein said exhaust device defines an exhaust port for opening toward said nozzle,
    said nozzle can receive a supply of a gas to generate a jet of said gas which is spouted toward said exhaust port and covers said opening,
    said exhaust device can discharge, to an outside of said processing vessel, said gas sucked through said exhaust port, and
    said processing vessel has a side wall which is smoothly curved inward as said opening is approached upward.

2. The drying apparatus as defined in claim 1, further comprising a cap for freely covering said opening.

3. The drying apparatus as defined in claim 1, further comprising a switching valve having an output coupled to said nozzle and being capable of freely selecting one of inputs to communicate with said output.

4. The drying apparatus as defined in claim 3, further comprising:
    a nonreactive gas feeding device configured to feed a nonreactive gas;
    a fire extinguishing gas feeding device configured to feed a fire extinguishing gas;
    a sensor for sensing that a fire is caused in said processing vessel and for outputting a predetermined signal; and
    a control device configured to control said switching operation of said switching valve in response to said signal output from said sensor,
    wherein said nonreactive gas feeding device is connected to one of said inputs,
    said fire extinguishing gas feeding device is connected to another one of said inputs, and
    said control device receives said signal to control said switching valve such that said input selected by said switching valve is switched from said input to which said nonreactive gas feeding device is connected to said input to which said fire extinguishing gas feeding device is connected.

5. The drying apparatus as defined in claim 1, wherein said nozzle can receive said supply of said gas to freely select and generate either said jet of said gas spouted toward said exhaust port and covering said opening or a jet of said gas spouted toward an inside of said processing vessel.

6. The drying apparatus as defined in claim 5, wherein said nozzle includes an inner nozzle member and an outer nozzle member engaged with an outside of said inner nozzle member,
    said inner nozzle member defines, on an inside thereof, a path causing a single inlet to branch off into two outlets,
    said outer nozzle member defines two openings, and
    one of said inner nozzle member and said outer nozzle member is rotatably engaged with the other and only one of said two outlets of said inner nozzle member selectively overlaps with either of said two openings of said outer nozzle member on the basis of a position of rotation.

7. The drying apparatus as defined in claim 5, wherein said nozzle includes a plurality of unit nozzles arranged in a line,
    each of said unit nozzles has an inner nozzle member and an outer nozzle member engaged with an outside of said inner nozzle member,
    said inner nozzle member defines, on an inside thereof, a path causing a single inlet to branch off into two outlets,
    said outer nozzle member defines two openings, and
    one of said inner nozzle member and said outer nozzle member is rotatably engaged with the other and only one of said two outlets of said inner nozzle member selectively overlaps with either of said two openings of said outer nozzle member on the basis of a position of rotation.

8. The drying apparatus as defined in claim 7, further comprising:
    a nonreactive gas feeding device configured to feed a nonreactive gas; and
    a pipe inter-connecting said nonreactive gas feeding device to said nozzle for feeding said nonreactive gas from said nonreactive gas feeding device to said nozzle, wherein said inner nozzle member belonging to each of said unit nozzles is fixedly connected to said pipe, said outer nozzle member belonging to each of said unit nozzles is rotatable with respect to said inner nozzle member, and its outer peripheral face has a cylindrical shape with a rotation axis as a center axis, and gears are formed on said cylindrical-shaped outer peripheral face, said gears are engaged with each other between said unit nozzles adjacent to each other, and said drying apparatus further comprising a driving device configured to drive a rotation of said outer nozzle belonging to at least one of said unit nozzles.

9. The drying apparatus as defined in claim 5, further comprising:

a sensor for sensing that a fire is caused in said processing vessel and for outputting a predetermined signal; and a control device configured to control said switching operation of said nozzle in response to said signal output from said sensor, wherein said control device receives said signal to control said nozzle so as to perform switching from said jet spouted toward said exhaust port to said jet spouted toward said inside of said processing vessel.

10. The drying apparatus as defined in claim 3, further comprising:

an ordinary temperature gas feeding device configured to feed a nonreactive gas having an ordinary temperature;

a cooled gas feeding device configured to feed a cooled nonreactive gas; and a control device configured to control said switching operation of said switching valve, wherein said ordinary temperature gas feeding device is connected to one of said inputs, said cooled gas feeding device is connected to another one of said inputs, and said control device controls said switching valve such that said jet generated by said nozzle is a jet of said cooled nonreactive gas only when said object to be processed is put into said processing vessel.

11. The drying apparatus as defined in claim 4, further comprising a plurality of units, each unit including said processing vessel, said heater, said nozzle, said exhaust device and said switching valve; and two branching pipes, wherein said nonreactive gas feeding device and said extinguishing gas feeding device are single in number for each and are connected in common to said switching valve belonging to each of said units through said two branching pipes.

12. The drying apparatus as defined in claim 1, wherein said nozzle includes a check valve for opening a path of said gas when said supply of said gas is received, and for blocking said path when said supply of said gas is not received.

13. The drying apparatus as defined in claim 1, further comprising a nonreactive gas feeding device configured to feed a nonreactive gas, wherein said nonreactive gas feeding device is connected to said nozzle.

14. The drying apparatus as defined in claim 13, wherein said nonreactive gas is a nitrogen gas.

15. The drying apparatus as defined in claim 13, further comprising a pipe and a cooling device provided in at least a part of said pipe, wherein said nonreactive gas feeding device is connected to said nozzle through said pipe, and said cooling device cools said nonreactive gas flowing through said pipe.

16. The drying apparatus as defined in claim 1, further comprising a pan provided in said processing vessel in an intermediate position between a bottom portion of said processing vessel and said opening of said processing vessel; and a pipe coupled to a bottom portion of said pan for discharging a liquid poured into said pan to an outside of said drying apparatus.

17. A method for storing and heating a water-soluble solvent, and causing a vapor generated from said solvent to condense on a surface of an object to be processed, thereby drying said surface of said object, comprising the steps of:

preparing a container-shaped processing vessel defining an upward opening on a top thereof, having a side wall which is smoothly curved inward as said opening is approached upward, and capable of storing said solvent;

feeding said solvent into said processing vessel to store said solvent in a part of said processing vessel;

generating a jet of a nonreactive gas so as to cover said opening;

discharging said nonreactive gas which is spouted and is covering said opening;

heating said solvent;

inserting said object into said processing vessel through said opening across said jet;

holding said inserted object above a liquid level of said solvent and drying said surface of said object by a vapor of said heated solvent; and taking said object to an outside of said processing vessel through said opening across said jet again after said step of drying.

18. The drying method as defined in claim 17, further comprising a step of switching said jet of said nonreactive gas to a jet of a fire extinguishing gas when a fire is caused in said processing vessel.

19. The drying method as defined in claim 17, further comprising a step of switching a direction of said jet of said nonreactive gas to a direction toward an inside of said processing vessel when a fire is caused in said processing vessel.

20. The drying method as defined in claim 17, further comprising a step of generating a jet of a cooled nonreactive gas as said jet when said object passes across said jet at said step of inserting.

* * * * *